(12) United States Patent
Yakobson

(10) Patent No.: US 6,436,276 B1
(45) Date of Patent: Aug. 20, 2002

(54) CATHODIC PHOTORESIST STRIPPING PROCESS

(75) Inventor: Eric Yakobson, Aliso Viejo, CA (US)

(73) Assignee: Polyclad Laminates, Inc., Franklin, NH (US)

( * ) Notice: Subject to any disclaimer, the term of this patent is extended or adjusted under 35 U.S.C. 154(b) by 0 days.

(21) Appl. No.: 09/684,199

(22) Filed: Oct. 6, 2000

Related U.S. Application Data

(60) Provisional application No. 60/158,213, filed on Oct. 7, 1999.

(51) Int. Cl.$^7$ .................................................. C25F 5/00
(52) U.S. Cl. ........................ 205/703; 205/705; 205/717; 205/723; 205/674
(58) Field of Search ................................ 205/717, 674, 205/703, 705, 723

(56) References Cited

U.S. PATENT DOCUMENTS 4,966,664 A * 10/1990 Buerk et al. ................. 205/705
4,968,398 A * 11/1990 Ogasawara ................. 205/705

* cited by examiner

*Primary Examiner*—Donald R. Valentine
(74) *Attorney, Agent, or Firm*—Mintz, Levin, Cohn, Ferris, Glovsky and Popeo, P.C.

(57) ABSTRACT

A novel photoresist stripping process is disclosed. Specifically, it has been found that if a printed wiring board panel having photoresist on its surface is used as a cathode during electrolysis in an alkaline solution, the result is a rapid and complete photoresist removal with minimal sheeting of removed photoresist and no evidence of chemical attack upon metallic traces on the printed wiring board.

6 Claims, No Drawings ably-available organic amine based strippers. Furthermore, whereas commercial organic amine based strippers typically can strip between about 800–1,200 mil square feet of photoresist per gallon of the stripping solution, common caustic-based strippers can only strip between about 200–250 mil square feet of photoresist per gallon.

CATHODIC PHOTORESIST STRIPPING PROCESS

The present application claims priority to provisional patent application Ser. No. 60/158,213, which was filed on Oct. 7, 1999.

FIELD OF THE INVENTION

The present invention relates to a cathodic photoresist stripping process. More particularly, the present invention relates to a method for stripping photoresist from a printed wiring board panel by connecting the printed wiring board to a DC power supply and using it as a cathode during electrolysis of an alkaline solution.

BACKGROUND OF THE INVENTION

Printed wiring boards (PWBs) are used throughout the electronics industry. These boards serve to mount and secure electronic components while providing electrical connection among them. Refinements to PWB manufacture can result in higher quality, more reliable PWBs as well as PWBs having smaller and/or more densely packed conductive traces. As a result, smaller PWBs resulting in smaller electronic devices can be manufactured.

The majority of PWBs are manufactured using a semi-additive technique. In order to define a conductive pattern on the surface of the PWB, an organic polymer resist layer in the form of either a dry film or liquid is applied to a copper-clad insulating panel. If the resist is of a "negative working photo-defined type", the panel is exposed to a pattern defining artwork and the unexposed portion of the resist is developed off. In a "positive working system", the exposed areas are rendered soluble in a developing solution. As an alternative, the resist image may be defined using a screen printing process, or less commonly, using electron beam or laser ablation.

After the resist image has been defined, the PWB surface is exposed to plating or etching steps, depending upon the board type and the manufacturing technique. Subsequently, it is typically necessary to remove the photopolymer resist layer to allow further processing of the PWB. Removal of the photopolymer resist layer is accomplished in a resist stripping process.

Strongly alkaline, i.e., caustic, solutions are known to remove photoresists. However, caustic-based strippers are usually not widely used in commercial applications due to their slow stripping speed, poor solution life, "sheeting" effect, inability to process fine line circuitry, and propensity to attack tin and tin/lead alloys. Each of these is discussed below.

Slow stripping speeds when using caustic solutions to remove photoresist following the formation of patterns on PWBs are undesirable in that the time needed to remove a typical dry film photoresist using a caustic-only solution is often two to three times longer than that needed to remove such photoresist using commercially-available organic amine based strippers. Furthermore, whereas commercial organic amine based strippers typically can strip between about 800–1,200 mil square feet of photoresist per gallon of the stripping solution, common caustic-based strippers can only strip between about 200–250 mil square feet of photoresist per gallon.

The mechanism of stripping using caustics is different from that using organic amine based strippers. Rather than break photoresists up into small particles, as organic amine based strippers do, caustics tend to swell most resists and strip them in large sheets. This is often referred to as a "sheeting" effect. Unfortunately, such stripped large sheets can redeposit onto the copper surface creating problems in subsequent etching steps. Additionally, these stripped resist sheets can clog filters and nozzles in spray machines, thereby rendering the equipment inoperable. As a result of the "sheeting" effect, it is impossible to cleanly strip swelled resist between electroplated copper and tin or tin/lead overplated fine-line traces. Unstripped resist particles entrapped between the fine traces cause severe defects ("short circuit") in subsequent etching steps. Additionally, tin and lead, which are commonly used as etch resist on outer layers of the PWB, are amphoteric metals that dissolve in caustic solutions. Caustic based strippers attack tin or tin/lead etch resist, creating serious problems. Finally, as tin accumulates in stripping solution, it can re-deposit on copper surfaces creating so-called "tin bleeding" defect, which also results in "short circuit" defects.

A typical proprietary resist stripping composition consists of a mixture of aliphatic or cyclic organic amines, organic quaternary ammonium hydroxides and organic solvents. In some instances, inorganic alkali metal hydroxides are also used as secondary alkalinity carriers. U.S. Pat. No. 5,545,353 describes a photoresist stripper composition containing an organic polar solvent, an alkanolamine and a thiocarboxylic acid as a corrosion inhibitor. U.S. Pat. No. 5,556,482 teaches a method of stripping photoresist with a composition comprising organic polar solvents, basic amines and an inhibitor. U.S. Pat. No. 4,904,571 discloses a method for removing photoresist in a solution which comprises alcohols, ethers, ketones, chlorinated chlorocarbons, aromatic hydrocarbons, alkali metal hydroxides, carbonates, phosphates, pyrophosphates, borohydrides and organic amine borane compounds.

SUMMARY OF THE INVENTION

The present invention is based upon the discovery that, if a PWB panel with imaged and developed photoresist on its surface is connected to a DC power supply and used as a negative electrode (cathode) during the electrolysis of an alkaline solution, a rapid and complete photoresist removal will occur with minimal "sheeting" effect, and no evidence of chemical attack on the copper and tin forming the conductive traces of the PWB.

DETAILED DESCRIPTION OF THE INVENTION

The process of electrolysis is widely used in PWB manufacture as well as in the metal finishing industries for electroplating and electrodeposition of various metals. Electrodeposited copper is used in PWB manufacturing processes to interconnect two or more layers of copper foil by electroplating it into vias. Electroplated tin or tin-lead alloys are used as etch resist. Electrodeposited nickel and gold are used as final finishes to preserve solderability of the PWB. Furthermore, a wide variety of metals are used in the metal finishing industry for corrosion protection, decorative purposes, or for imparting various functional properties to the underlying substrate. For example, plastic substrates are commonly electroplated to render their surfaces electrically conductive. In each of the examples above, electrolysis is utilized to electrodeposit various metals onto the substrate surface.

Alkaline solutions conduct electricity and, therefore, can be electrolyzed. In such solutions, in the absence of metal complexes that can be cathodically reduced to metallic state, no metal deposition takes place, since alkali or alkaline earth metals thermodynamically cannot be electrodeposited out of aqueous solutions, whereas organic alkalis do not contain any metal ions. As noted above, it has surprisingly been found that if a PWB panel with photoresist on its surface is connected to a DC power supply and used as a negative electrode (cathode) during an electrolysis process of an alkaline solution, a rapid and complete photoresist removal occurs with reduced "sheeting" effect and minimal evidence of chemical attack on copper or tin.

During the process of electrolysis, two electrodes are connected to an electric power supply and immersed into an electrolyte solution. If the electrolyte is an alkali metal hydroxide solution, the following reactions will take place in the bulk of the solution and at the electrodes:

Solution:

$$MeOH \rightarrow Me^+ + OH^-$$

$$H_2O \rightarrow H^+ + OH^-$$

(where Me is any alkali or alkaline earth metal)

Cathode:

$$2H^+ + 2e^- \rightarrow H_2$$

Anode:

$$4OH^- - 4e^- \rightarrow O_2 + 2H_2O$$

Subsequently, during the electrolysis process, oxygen gas will evolve at the anode, (i.e., the positive electrode), and hydrogen gas will be generated at the cathode, (i.e., the negative electrode). Similar reactions will take place if a solution of an organic alkali or an alkaline salt (which forms an alkali in the solution due to hydrolysis) is electrolyzed.

A PWB panel with photoresist on its surface can be immersed in such an alkaline solution and connected as a negative electrode (cathode) to a power supply. A dimensionally stable anode (DSA) or any conventional insoluble anode can serve as a positive electrode (anode). Once a PWB panel is immersed into the alkaline stripping solution, the solution will start to soften and swell the photoresist polymer. At the same time, hydrogen gas will begin to evolve on the exposed metal areas. Depending on the voltage applied and the conductivity of the solution, the evolution of hydrogen gas can be quite vigorous. The bubbles of the hydrogen gas evolving on the copper surface, including copper and the photoresist interface, will lift the edges of the swollen photoresist film, tear it into smaller pieces, and remove it from the copper surface. Furthermore, since H$^+$ions are being consumed at the cathode for the hydrogen gas evolution, the pH of the solution adjacent to the cathode will become more alkaline, thus increasing photoresist dissolution and the stripping rate. As a result, the resist stripping on the cathode will occur in a much faster and more efficient manner than in an alkaline solution without the application of electric current.

This process offers several significant and novel features when compared to conventional or caustic-based resist stripping processes. In particular, as compared to caustic-based strippers, the stripping process of the present invention provides improved stripping speed and solution life. Additionally, the stripping process of the present invention minimizes the "sheeting" effect, allows the processing of fine line circuitry and eliminates attack on tin and tin-lead traces.

The use of the cathodic photoresist stripping process described above has been found to remove typical photoresists faster than is commonly expected for the removal of photoresist using conventional organic amine-based or caustic-based resist strippers. As a result, the processing time of the PWB can be shortened. Additionally, because of the faster stripping time, the photoresist particles are quickly removed from the solution by filtration, thereby preventing them from dissolving in the solution and neutralizing it. As a result, solution neutralization is minimized, and a longer solution life results.

As noted above, the electrolysis procedure of the present invention results in the evolution of hydrogen, which can be, at times, quite vigorous. The hydrogen evolution tends to tear the photoresist into smaller pieces, thus, preventing the formation of photoresist sheets and effectively minimizing the "sheeting" effect and problems associated with it. The evolution of hydrogen also provides a scrubbing action which acts to efficiently clean out small photoresist particle residues which can remain between overplated fine lines, and which to date, have been difficult to remove using conventional resist strippers. Additionally, continuous hydrogen evolution keeps the stripped particles away from the panel, effectively preventing their redeposition on the panel. Finally, the reducing action of the electric current at the cathode acts to protect the metallic surface from oxidation, i.e., caustic attack, thereby preventing damage to tin and tin-lead surfaces.

Additional benefits can be achieved by the inventive resist stripping process if the anodes of the apparatus are separated from the chamber on which stripping takes place by an anion-selective membrane. During the stripping process, carboxylic acid groups within the photoresist polymer react with cations in the solution to form carboxylate salts. Electric current drives negatively charged anions toward the positively charged anode. Anions migrate freely through the anion-selective membrane into the anode chamber. At the anode, oxygen evolution occurs resulting from decomposition of hydroxyl ions. As the concentration of the hydroxyl ions in the anolyte solution is depleted the pH of the solution decreases. At about neutral pH, the dissolved portion of the photoresist polymer starts to precipitate out of the anolyte. Thus, the stripping solution is continuously regenerated as the photoresist is removed from the main stripping chamber, precipitated in the anode chamber, and filtered out. At the same time, the pH of the main stripping chamber does not drop due to removal of the anions as it does in conventional resist stripping processes. On the contrary, the pH of the solution increases due to hydrogen gas evolution, which continuously removes H$^+$ions from the solution. Therefore, there is no need for continuous addition of fresh resist stripping solution to maintain the pH. The resulting system is more economical, efficient and environmentally sound.

Alkali or alkaline earth metal hydroxides or their respective salts are the preferred alkalinity carriers in the solution for cathodic photoresist stripping. Additionally, other alkaline inorganic or organic salts as well as organic alkalis can be used as secondary conductivity and alkalinity enhancers. Horizontal conveyorized equipment such as described in U.S. Pat. No. 5,292,424, which is commonly used in PWB manufacturing steps such as, for example, electroplating steps, can be utilized for cathodic photoresist stripping to reduce handling and cycle time. As a result, increased productivity and a reduced defect rate is achieved.

Optionally, ultrasonic agitation can also be provided in order to create cavitation at the photoresist/solution interface, thereby enhancing the stripping rate.

EXAMPLES

The following examples illustrate the invention:

Example 1

A 0.5% (by weight) sodium hydroxide solution in DI water was prepared and heated to 55° C. (130° F.). A circuit board panel with imaged and developed 2 mil thick Morton Laminar HG dry film was immersed into the 0.5% NaOH solution. The film stripped in 4 minutes and 15 seconds. Another identical panel was immersed into the same solution. This second panel was stripped in 4 minutes and 25 seconds.

Example 2

Example 1 was repeated except 0.5% potassium hydroxide solution was used for stripping. The panels stripped in 4 minutes and 35 seconds and 4 minutes and 50 seconds respectively.

Example 3

Example 1 was repeated except 1% sodium silicate solution was used for stripping. The panels stripped in 4 minutes and 5 seconds and 4 minutes and 15 seconds respectively.

Example 4

Example 1 was repeated except 1% tetramethyl ammonium hydroxide solution was used for stripping. The panels stripped in 4 minutes and 20 seconds and 4 minutes and 40 seconds respectively.

Comparative Example 1

Example 1 was repeated except during the stripping the panel was connected to a power supply as cathode and electrolyzed at current density of 70 A/ft$^2$. The panels stripped in 1 minute and 23 seconds and 1 minute and 15 seconds respectively.

Comparative Example 2

Example 2 was repeated except during the stripping the panel was connected to a power supply as cathode and electrolyzed at current density of 80 A/ft$^2$. The panels stripped in 1 minute and 10 seconds and 1 minute and 24 seconds respectively.

Comparative Example 3

Example 3 was repeated except during the stripping the panel was connected to a power supply as cathode and electrolyzed at current density of 60 A/ft$^2$. Both panels stripped in 1 minute and 15 seconds

Comparative Example 4

Example 4 was repeated except during the stripping the panel was connected to a power supply as cathode and electrolyzed at current density of 70 A/ft$^2$. The panels stripped in 1 minute and 23 seconds and 1 minute and 20 seconds respectively.

What is claimed is:

1. A process for stripping photoresist from a printed wiring board panel, the process comprising the steps of:

(a) providing a printed wiring board panel having photoresist on at least one surface of said panel and comprising a layer of copper on said at least one surface of said printed wiring board panel, the photoresist being fully strippable, absent electrolysis, in an electrolytic alkaline stripping solution;

(b) connecting said printed wiring board panel to a power supply; and (c) immersing said printed wiring board in the electrolytic alkaline stripping solution, such that said printed wiring board is used as a negative electrode during electrolysis of said alkaline stripping solution;

wherein said photoresist on said at least one surface of said printed wiring board panel is removed from said at least one surface of said printed wiring board panel and the photoresist removal is accelerated by the electrolysis of the alkaline stripping solution.

2. The process of claim 1, wherein said printed wiring board panel is connected as a negative electrode to said power supply.

3. The process of claim 1, wherein said electrolytic solution is an alkali, alkaline earth metal hydroxide or organic alkali solution.

4. A process for stripping photoresist from a printed wiring board panel, the process comprising the steps of:

(a) providing a printed wiring board panel having photoresist on at least one surface of said panel and comprising a layer of copper on said at least one surface of said printed wiring board panel;

(b) connecting said printed wiring board panel to a power supply; and (c) immersing said printed wiring board in a stripping chamber containing electrolytic alkaline stripping solution, said stripping chamber is separated from an anode chamber by an anion-selective membrane, said anode chamber containing an insoluble anode whereby regeneration of stripping solution occurs when said electrolytic alkaline stripping solution passes from said stripping chamber through said anion-selective membrane into said anode chamber.

5. The process of claim 4, wherein said printed wiring board panel is connected as a negative electrode to said power supply.

6. The process of claim 4, wherein said electrolytic solution is an alkali, alkaline earth metal hydroxide or organic alkali solution.

* * * * *